United States Patent
Stepniak et al.

(10) Patent No.: US 6,916,684 B2
(45) Date of Patent: Jul. 12, 2005

(54) WAFER-APPLIED UNDERFILL PROCESS

(75) Inventors: Frank Stepniak, Noblesville, IN (US); Matthew R. Walsh, Sharpsville, IN (US); Arun K. Chaudhuri, Carmel, IN (US); Michael J. Varnau, Russiaville, IN (US)

(73) Assignee: Delphi Technologies, Inc., Troy, MI (US)

( * ) Notice: Subject to any disclaimer, the term of this patent is extended or adjusted under 35 U.S.C. 154(b) by 308 days.

(21) Appl. No.: 10/391,101

(22) Filed: Mar. 18, 2003

(65) Prior Publication Data

US 2004/0185601 A1 Sep. 23, 2004

(51) Int. Cl.[7] .............................................. H01L 21/44
(52) U.S. Cl. ...................... 438/108; 438/612; 438/613; 438/614; 438/615; 438/116; 438/660; 428/41.8; 428/40.1
(58) Field of Search ................................. 438/108, 612, 438/613, 614, 615, 616, 660; 428/41.8, 40.1

(56) References Cited

U.S. PATENT DOCUMENTS

| | | | |
|---|---|---|---|
| 5,607,099 A | | 3/1997 | Yeh et al. |
| 5,811,317 A | * | 9/1998 | Maheshwari et al. ......... 29/827 |
| 6,010,577 A | | 1/2000 | Bristol et al. |
| 6,170,735 B1 | | 1/2001 | Bristol et al. |
| 6,193,812 B1 | | 2/2001 | Bristol et al. |
| 6,281,106 B1 | | 8/2001 | Higdon et al. |
| 6,614,122 B1 | * | 9/2003 | Dory et al. .................. 257/787 |
| 6,686,015 B2 | * | 2/2004 | Raab et al. ................. 428/40.1 |
| 6,774,497 B1 | * | 8/2004 | Qi et al. ...................... 257/783 |
| 6,821,878 B2 | * | 11/2004 | Danvir et al. ............... 438/613 |
| 2002/0076854 A1 | * | 6/2002 | Pierce ......................... 438/118 |
| 2004/0113281 A1 | * | 6/2004 | Brandenburg et al. ...... 257/778 |
| 2004/0118599 A1 | * | 6/2004 | Chason et al. .............. 174/260 |
| 2004/0180474 A1 | * | 9/2004 | Oman ......................... 438/125 |

* cited by examiner

*Primary Examiner*—David Zarneke
*Assistant Examiner*—Victor V. Yevsikov
(74) *Attorney, Agent, or Firm*—Stefan V. Chmielewski

(57) ABSTRACT

A process for underfilling a bumped die surface using a lamination step and compound film such that solder bumps on the die are exposed during lamination. The compound film comprises a first layer containing an underfill material and a second layer on the first layer. The underfill material and the second layer comprise polymer materials that differ from each other. The compound film is laminated to the die, preferably at the wafer level, so that the underfill material is forced between the solder bumps and fills spaces between the bumps but does not cover the bumps. In contrast, the second layer covers the solder bumps, but is then selectively removed to re-expose the solder bumps and the underfill material therebetween.

20 Claims, 1 Drawing Sheet

WAFER-APPLIED UNDERFILL PROCESS

CROSS REFERENCE TO RELATED APPLICATIONS

Not applicable.

STATEMENT REGARDING FEDERALLY SPONSORED RESEARCH

Not applicable.

BACKGROUND OF THE INVENTION (1) Field of the Invention

The present invention generally relates to underfill processes and materials for flip-chip mounted die. More particularly, this invention relates to a process for applying an underfill laminate material to a bumped wafer surface, and then thinning the underfill laminate to re-expose the solder bumps to leave an underfill material of uniform and consistent thickness.

(2) Description of the Related Art

Underfilling is a well known technique for promoting the reliability of surface-mount components, such as flip chips and ball grid array (BGA) packages, that are physically and electrically connected with numerous solder bump connections to traces on an inorganic or organic substrate, such as a reinforced epoxy resin laminate circuit board. The underfill process generally involves using a specially formulated dielectric material to completely fill the void between a component, e.g., die, and substrate and to encapsulate the solder bump connections therebetween. The basic function of the underfill is to reduce the thermal expansion mismatch loading on the solder connections. For this purpose, underfill materials must have a coefficient of thermal expansion (CTE) that is relatively close to that of the solder connections, die and substrate to minimize CTE mismatches that would otherwise reduce the thermal fatigue life of the solder connections.

In conventional practice, underfilling takes place after the die is attached to the substrate. The underfill material is placed along the perimeter of the die, and capillary action is relied on to draw the material beneath the die. Dielectric materials having suitable flow and processing characteristics for capillary underfill processes are typically thermosetting polymers such as epoxies. To achieve an acceptable CTE, a fine particulate filler material such as silica is added to the underfill material to lower the CTE from that of the polymer to something that is more compatible with the CTE's of the die, substrate, and the solder composition of the solder connections. For optimum reliability, the composition of an underfill material and the underfill process parameters must be carefully controlled so that voids will not occur in the underfill material beneath the die, and to ensure that a uniform fillet is formed along the entire perimeter of the die. Both of these aspects are essential factors in terms of the thermal cycle fatigue resistance of the solder connections encapsulated by the underfill.

While capillary-flow underfill materials have been widely and successfully used in flip chip assembly processes, expensive process steps are typically required to repeatably produce void-free underfills. Capillary underfill materials are serially applied to die using expensive dispensing equipment, and are then cured at an elevated temperature (e.g., about 150° C.) for several hours. As a result, the capillary underfill process is a batch-like process that disrupts an otherwise continuous flip chip assembly process. Also, the adhesive strength of a capillary underfill material critically depends on the cleanliness of the die after reflow, necessitating costly cleaning equipment and complex process monitoring protocols. As such, the benefits of flip chip assembly using capillary underfill materials must be weighed against the burden of the capillary underfill process itself.

In view of the above, alternative underfill techniques have been developed. One such technique is to deposit a "no-flow" underfill material on the substrate surface, after which the bumped die is placed on the substrate (forcing the solder bumps through the underfill material), and the die is attached (reflow soldered) to the substrate. Another technique is to laminate a film of underfill material to a bumped wafer prior to die singulation and attachment. With this technique, referred to as wafer-applied underfill (WAU), the solder bumps on the wafer must be re-exposed, such as by burnishing or a laser ablation process.

The process of mounting and underfilling flip chips on laminate substrates can be improved and simplified using the laminate underfill process. In particular, an underfill film that can be applied to a die at wafer-level vastly improves economies of scale and eliminates key inefficiencies found in the capillary underfill process. However, a difficulty in implementing the WAU process centers on the burnishing step, which is a chemical-mechanical polishing (CMP) type process that reduces the thickness of the underfill material to something less than the solder bump height. Burnishing must adequately remove the underfill material, both the polymer matrix material (e.g., epoxy) and the filler material (e.g., silica), from the upper bump surface in order to permit the molten solder bumps to wet the metal traces on the substrate during solder reflow. Since yield losses are unacceptable, the importance of exposed bumps cannot be understated. However, the burnishing process presents several challenges. First, post-burnish height uniformity has been observed to play an important role in assembly yield, yet burnishing techniques are often not sufficiently reproducible. For example, too much material is often left around the bumps and too little material remains near the edges of the die after burnishing to form an adequate fillet. Second, burnishing involves the use of a solvent to chemically dissolve (remove) the polymer matrix material. Suitable organic solvents can have safety issues and require special handling of post-burnished material, i.e., burnished films must be redried by a vacuum bake. Furthermore, the ratio of filler to polymer removal depends on the burnishing media, amount of solvent, time, and burnishing force, the latter of which has proven difficult to control. Also, current equipment sets used in wafer CMP fabrication are optimized for the removal of small amounts (e.g., about one micrometer) of hard filler material, while laminate underfill processes require the removal of a relatively thick (about fifty micrometers) and soft (uncured epoxy/polymer mixture) film layer.

In view of the above, it would be desirable if a laminate underfill process were available that overcame the difficulties and shortcomings of existing WAU processes.

BRIEF SUMMARY OF THE INVENTION

The present invention provides a process for underfilling a bumped die surface using a laminating step and film such that the solder bumps on the die surface are exposed during lamination, eliminating the need to remove a portion of the underfill material through a burnishing step. According to a preferred aspect of the invention, the underfill material is amenable to being deposited at the wafer level.

The underfill process of this invention generally entails laminating a compound film to a surface of a component on which solder bumps are present. The component is preferably one of a number of die defined in a wafer, and the compound film is preferably applied to the bumped surface of the wafer. The compound film comprises a first layer containing an underfill material, and a second layer on (e.g., laminated to) the first layer. The underfill material and the second layer comprise first and second polymer materials that differ from each other. The compound film is laminated to the wafer so that the underfill material is forced between the solder bumps and fills spaces between the solder bumps, but does not cover the solder bumps. In contrast, the second layer covers the solder bumps immediately after laminating the compound film to the wafer surface. The second layer is then selectively removed to expose the solder bumps and the underfill material between the solder bumps. Because of the difference in the polymer materials used to form the first and second layers, the second layer can be readily removed from the first layer by mechanical and/or chemical means without substantially removing any of the first layer.

Following removal of the second layer, individual components (die) are singulated from the wafer. Assembly preferably then proceeds by applying a flux adhesive to a substrate to which one of the components is to be attached. The solder bumps on the components are then registered with bond pads on the substrate so that the underfill material is present in a space defined by and between the component and substrate. Thereafter, the solder bumps, underfill material and flux adhesive are heated to melt the solder bumps, during which time the flux adhesive removes any unsolderable metal oxides that would interfere with wetting and bonding of the solder to the bond pads. Upon cooling, the solder forms solid electrical connections that are metallurgically bonded to the bond pads and encapsulated by an underfill formed by the underfill material and adhesive.

According to a preferred aspect of the invention, the lamination process is a series operation instead of a batch operation, and at the completion of the lamination process the solder bumps are exposed and ready for registration with appropriate terminals on a substrate surface to which the component is to be attached. As such, the prior art requirement for burnishing the underfill material to re-expose the solder bumps is completely eliminated, and a suitable thickness for the underfill material on the component can be more readily and consistently obtained by forming the first layer of the compound film to have a uniform thickness. Accordingly, the present invention offers the ability to consistently form underfills of more uniform thickness, while reducing processing costs and avoiding the use of solvents.

Other objects and advantages of this invention will be better appreciated from the following detailed description.

DETAILED DESCRIPTION OF THE INVENTION

Figure 1:
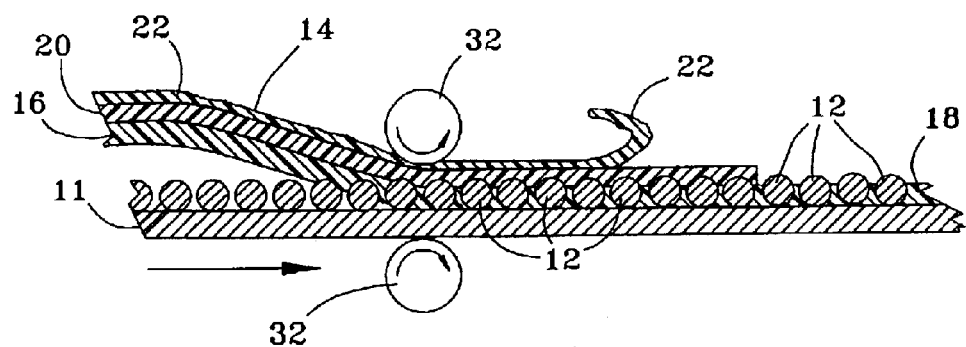
FIG. 1 represents an underfill lamination process performed on a bumped wafer in accordance with the present invention.
Figure 2:
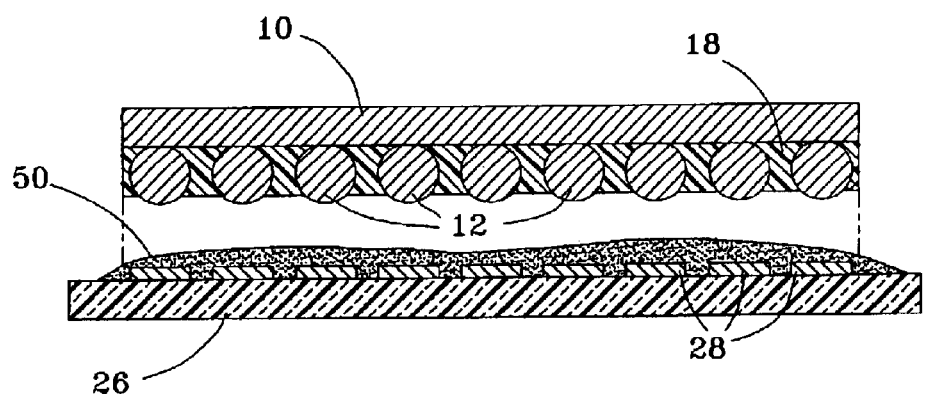
FIGS. 2 and 3 are side views representing the steps of registering a die singulated from the wafer of FIG. 1 with a substrate, and then reflow soldering the die to the substrate.
Figure 3:
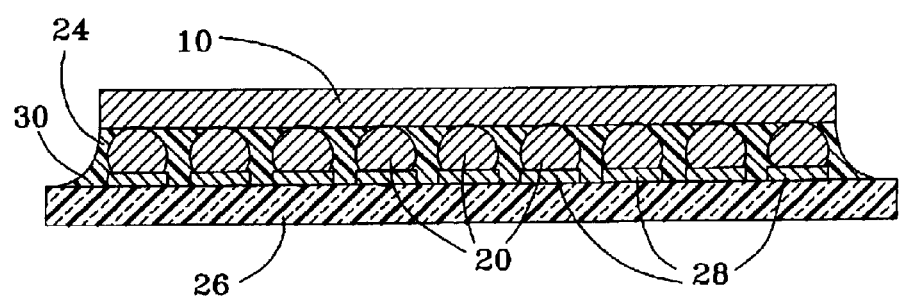

FIG. 1 represents a portion of a wafer 11 in which individual die are defined and on which an underfill material 18 is being applied in accordance with the present invention. As illustrated, the invention finds use in the fabrication of semiconductor devices, such that silicon or another semiconductor is a suitable material for the wafer 11 (and therefore the die). Furthermore, the invention finds particular application in the process of attaching flip chips, as represented in FIGS. 2 and 3, in which a die 10 singulated from the wafer 11 of FIG. 1 is shown being attached to bond pads 28 on a substrate 26. However, other types of devices that are attached by reflowing solder bumps are also within the scope of this invention.

As represented in FIG. 1, a compound film 14 is in the process of being laminated to the surface of the wafer 11 on which solder bumps 12 are present. The compound film 14 is represented as a unitary film comprising an underfill layer 16, a sacrificial layer 20 laminated to the underfill layer 16, and a release liner 22 laminated to the sacrificial layer 20. The compound film 14 is preferably laminated to the wafer 11 through the application of sufficient heat and force to cause the underfill layer 16 to deform and flow, such that the underfill material 18 is between the solder bumps 12 and preferably fills all lateral spaces between the bumps 12, as seen in FIG. 1. Furthermore, the thickness of the underfill material 18 is shown as being less than the solder bump height, such that the solder bumps 12 completely penetrate the underfill material 18. In contrast, the sacrificial layer 20 is not penetrated by the solder bumps 12, but instead remains intact and completely covers the solder bumps 12 immediately following lamination. At most, FIG. 1 represents the laminating step as having caused limited portions of the sacrificial layer 20 to flow downwardly between the solder bumps 12. While FIG. 1 shows the required force being applied to the compound film 14 and the wafer 11 with rollers 32, other suitable means could be adopted by those skilled in the art. The liner 22 is shown as being removed by peeling or another suitable technique that is performed in series with and immediately following the lamination step. Thereafter, the sacrificial layer 20 is represented as being removed from the surface of the underfill material 18, thereby re-exposing the upper surfaces of the solder bumps 12. The process of removing the sacrificial layer 20 is also represented as being performed in series with the lamination step.

The liner 22 can be any conventional liner material used in the art for WAU processes. A suitable liner material is a Mylar or a similar polyolefin. The underfill layer 16 (and therefore the underfill material 18) generally comprises a dielectric polymer material in which a filler material is dispersed. Suitable materials for the polymer matrix include low viscosity resins such as those disclosed in International Publication Number WO 02/33751 A1. The filler material is chosen in part on the basis of having a coefficient of thermal expansion (CTE) that is lower than that of the polymer matrix for the purpose of reducing the overall CTE of the underfill material 18 to something closer to the CTE's of the substrate 26, wafer 11 (and die 10), and solder bumps 12. Suitable compositions for the filler material include silica, though other filler materials could be used, including silicon nitride ($Si_3N_4$), silicon carbide (SiC), aluminum nitride (AlN), boron nitride (BN), or various other materials with suitably low CTE's. In view of the lamination process, suitable particle sizes for the filler material are those that will not impede the penetration of the underfill layer 16 by the solder bumps 12.

To facilitate its separation from the underfill material 18, the sacrificial layer 20 is formed of a material that differs in composition from the polymer matrix of the underfill material 18. The type of material best suited for the sacrificial layer 20 will depend in part on the technique used to remove the layer 20. In one embodiment, the sacrificial layer 20 is mechanically removed, such as by peeling, in which case the sacrificial layer 20 is formed of a butadiene-based rubber so as not to adhere excessively to the underfill material 18 following lamination. In another embodiment, the sacrificial layer 20 is removed chemically, in which case the sacrificial layer 20 is formed of a material that can be dissolved or otherwise removed from the surface of the underfill material 18 without removing the underfill material 18 or damaging the solder bumps 12. In this case, suitable materials for the sacrificial layer 20 include a subset of dry film photoresists containing, for example, polymerized methacrylic acid commercially available from Morton under the name Laminar GA film. Suitable chemical techniques for removing the sacrificial layer 20 include spray or immersion etching in an aqueous-based solution containing sodium carbonate or trisodium phosphate in low (e.g., 2 wt. %) concentrations. Because the sacrificial layer 20 is not a permanent component of the die underfill, the layer 20 is preferably free of any particulate filler material.

Following lamination and then removal of the sacrificial layer 20 and liner 22, the die 10 are singulated from the wafer 11 in any suitable manner. FIGS. 2 and 3 represent steps by which a die 10 singulated from the wafer 11 shown in FIG. 1 can be flip-chip mounted to a substrate 26 on which bond pads 28 (or other suitable terminals) are provided for registration with the solder bumps 12 on the die 10. The substrate 26 may be a circuit board formed of various materials, such as a thin laminate printed wiring board (PWB), or any other suitable chip carrier or circuit board material known in the art. As is evident from FIGS. 1 and 2, the underfill material 18 does not cover the solder bumps 12 on the die 10, but instead is limited to filling the spaces between solder bumps 12 on the die surface. Prior to die placement, a flux adhesive 50 is preferably applied to the surface of the substrate 26 to provide a fluxing capability, by which oxides present on the solder bumps 12 and/or bond pads 28 are cracked, displaced and/or reduced so as not to interfere with the ability of these features to metallurgically bond to each other. Following die placement, the flux adhesive 50 is incorporated into the underfill material 18 to form an underfill 24 (FIG. 3). A suitable material for the flux adhesive 50 is commercially available from 3M under the name UF 3400, though it is foreseeable that other fluxing compounds could be used.

FIG. 3 represents the result of reflowing the solder bumps 12 to form solder connections 20 that electrically interconnect the bond pads 28 with circuitry (not shown) on the die 10. During the reflow process, the underfill material 18 flows and becomes incorporated with the flux adhesive 50, forming the underfill 24 in which the filler material is dispersed. Upon cooling the die assembly, the underfill 24 encapsulates the solder connections 20 and is bonded to the substrate 26 and die 10. The underfill 24 is void-free, completely filling the spaces between the solder connections 20 and the space between the lower surface of the die 10 and the upper surface of the substrate 26. In addition, the underfill 24 preferably forms a fillet 30 along the peripheral wall of the die 10, as depicted in FIG. 3. A sufficient amount of the underfill material 18 and flux adhesive 50 must be present between the die 10 and substrate 26 to form an adequate fillet 30, yet not so much as to prevent complete penetration of the solder bumps 12 through the underfill material 18 during lamination. As a result of the lamination process, the thickness of the underfill material 18 directly depends on the original thickness of the underfill layer 16. A suitable height for the solder bumps 12 will depend on bump to bump spacing and typically vary between about fifty and about one hundred and fifty micrometers. A suitable thickness for the original underfill layer 16 of the compound film 14 is about 50% to about 85% of the height of the solder bumps 12. The uniformity of the underfill thickness also closely corresponds to that of the original underfill layer 16. As such, the thickness of the underfill layer 16 within the compound film 14 should also be uniform, e.g., not vary by more than ten micrometers.

Because the sacrificial layer 20 does not form a permanent part of the underfill 24, the thickness of the sacrificial layer 20 is not critical, other than being capable of removal from the underfill material 18 without undue difficulty. For this reason, a suitable thickness for the sacrificial layer 16 is about twenty-five to about one hundred micrometers, though lesser and greater thicknesses are foreseeable.

In view of the process by which the underfill 24 is applied to the die 10, the underfill 24 can be readily formulated to contain an amount of filler that will yield a CTE that is sufficiently close to that of the solder connections 20 to improve the reliability of the die assembly. As a result, the underfill process of this invention enables CTE matching in a wider variety of flip chip applications than capillary-flow underfill materials and processes. The WAU process of this invention also has the advantage of a simplified manufacturing process and a reduced number of process steps as compared to capillary-flow underfill materials. Because the underfill material 18 is applied in a lamination process that does not result in the underfill material 18 covering the solder bumps 12, the underfill process of this invention avoids the prior art practice of burnishing or ablating a laminated underfill material to re-expose solder bumps on a die surface prior to die attachment. According to a preferred aspect of the invention, the underfill material 18 is deposited at the wafer level, which permits greater economies of scale and eliminates key inefficiencies found in existing no-flow and capillary flow underfill processes.

While the invention has been described in terms of a preferred embodiment, it is apparent that other forms could be adopted by one skilled in the art. Accordingly, the scope of the invention is to be limited only by the following claims.

What is claimed is:

1. A method of underfilling a bumped component with an underfill material, the method comprising the steps of:

laminating a compound film to a surface of the component on which solder bumps are present, the compound film comprising a first layer containing the underfill material and a second layer on the first layer, the underfill material comprising a first polymer material and the second layer comprising a second polymer material that differs from the first polymer material, the compound film being laminated to the component so that the underfill material is forced between the solder bumps and fills spaces between the solder bumps but does not cover the solder bumps and so that the second layer covers the solder bumps; and then selectively removing the second layer to expose the solder bumps and the underfill material between the solder bumps.

2. The method according to claim 1, further comprising the steps of:

registering the solder bumps on the component with bond pads on a surface of a substrate on which a flux adhesive has been applied so that the underfill material is present in a space defined by and between the component and the substrate;

heating the solder bumps, the underfill material and the flux adhesive so that the solder bumps melt and so that the underfill material and the flux adhesive combine to form an underfill; and then cooling the molten solder bumps and the underfill so that the molten solder bumps form solid electrical connections that are metallurgically bonded to the bond pads and encapsulated by the underfill.

3. The method according to claim 1, wherein the laminating step is performed at wafer-level and the component is one of a plurality of die defined in a wafer.

4. The method according to claim 1, wherein the compound film further comprises a liner on the second layer, the liner being removed before removing the second layer.

5. The method according to claim 1, wherein the second layer is mechanically removed without removing substantially any of the underfill material.

6. The method according to claim 1, wherein the second layer is chemically removed without removing substantially any of the underfill material as a result of the second polymer material of the second layer differing from the first polymer material of the underfill material.

7. The method according to claim 6, wherein the second polymer material is chosen from the group consisting of butadiene-based rubbers and dry film photoresists.

8. The method according to claim 1, wherein the first layer consists essentially of the underfill material and a filler material dispersed in the underfill material.

9. The method according to claim 8, wherein the second layer is substantially free of a particulate filler material.

10. The method according to claim 1, wherein the compound film is laminated to the component through application of force and heat so that the underfill material is penetrated by the solder bumps.

11. The method according to claim 10, wherein the laminating step causes the underfill material to have a substantially uniform thickness that is less than the height of the solder bumps.

12. The method according to claim 1, wherein the laminating step causes limited portions of the second layer to flow between the solder bumps.

13. A method of underfilling a bumped flip chip die, the method comprising the steps of:

forming a compound film comprising an underfill layer, a sacrificial layer on the underfill layer, and a liner on the sacrificial layer, the underfill layer comprising a polymeric underfill material and the sacrificial layer comprising a polymer material that differs from the underfill material;

laminating the compound film to a surface of a wafer in which individual die are delineated, each of the die having solder bumps associated therewith, the compound film being laminated to the wafer so that the underfill material is penetrated by the solder bumps and fills spaces between the solder bumps but does not cover the solder bumps and so that the sacrificial layer covers the solder bumps;

selectively removing the sacrificial layer to expose the solder bumps and the underfill material between the solder bumps;

singulating the die from the wafer;

registering the solder bumps of one of the die with bond pads on a surface of a substrate on which a flux adhesive has been applied so that the underfill material and the flux adhesive are present in a space defined by and between the die and the substrate;

heating the solder bumps, the underfill material and the flux adhesive so that the solder bumps melt and so that the underfill material and the flux adhesive combine to form an underfill; and then cooling the molten solder bumps and the underfill so that the molten solder bumps form solid electrical connections that are metallurgically bonded to the bond pads and encapsulated by the underfill, the space between the die and the substrate being free of voids.

14. The method according to claim 13, further comprising the step of removing the liner before removing the sacrificial layer.

15. The method according to claim 13, wherein the sacrificial layer is mechanically removed by peeling without removing substantially any of the underfill material.

16. The method according to claim 13, wherein the sacrificial layer is chemically removed without removing substantially any of the underfill material as a result of the polymer material of the sacrificial layer differing from the underfill material.

17. The method according to claim 16, wherein the polymer material of the sacrificial layer is chosen from the group consisting of dry film photoresists.

18. The method according to claim 13, wherein the polymer material of the sacrificial layer is chosen from the group consisting of butadiene-based rubbers and dry film photoresists.

19. The method according to claim 13, wherein the underfill layer consists essentially of the underfill material and a filler material dispersed in the underfill material, and wherein the sacrificial layer is substantially free of a particulate filler material.

20. The method according to claim 13, wherein the laminating step causes the underfill material to have a substantially uniform thickness that is less than the height of the solder bumps.

* * * * *